United States Patent
Wang et al.

(10) Patent No.: US 7,433,381 B2
(45) Date of Patent: Oct. 7, 2008

(54) INP BASED LONG WAVELENGTH VCSEL

(75) Inventors: Tzu-Yu Wang, Maple Grove, MN (US);
Hoki Kwon, Plymouth, MN (US);
Jae-Hyun Ryou, Maple Grove, MN (US); Gyoungwon Park, Medina, MN (US); Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/606,104

(22) Filed: Jun. 25, 2003

(65) Prior Publication Data

US 2004/0264541 A1    Dec. 30, 2004

(51) Int. Cl.
*H01S 5/00* (2006.01)
*H01S 3/08* (2006.01)

(52) U.S. Cl. .................. 372/50.124; 372/92; 372/98; 372/99

(58) Field of Classification Search ............ 372/50.124, 372/92, 98–99
See application file for complete search history.

(56) References Cited

U.S. PATENT DOCUMENTS

| | | |
|---|---|---|
| 4,317,085 A | 2/1982 | Brunham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |

(Continued)

FOREIGN PATENT DOCUMENTS

DE    4240706 A1    6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—Minsun Harvey
*Assistant Examiner*—Phillip Nguyen
(74) *Attorney, Agent, or Firm*—Workman Nydegger (57) ABSTRACT

A long wavelength vertical cavity surface emitting laser having a substrate, a first mirror situated on the substrate, an active region situated on the first mirror, a second mirror situated on the active region. The first mirror may have several pairs of layers with an oxidized layer in one or more pairs of that mirror. The substrate may include InP and the mirror components may be compatible with the InP. The one or more layers in the first mirror may be oxidized via a trench-like approach or other arrangement.

8 Claims, 10 Drawing Sheets

U.S. PATENT DOCUMENTS

| | | | |
|---|---|---|---|
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,212,706 A | 5/1993 | Jain | |
| 5,216,263 A | 6/1993 | Paoli | |
| 5,216,680 A | 6/1993 | Magnusson et al. | |
| 5,237,581 A | 8/1993 | Asada et al. | |
| 5,245,622 A | 9/1993 | Jewell et al. | |
| 5,258,990 A | 11/1993 | Olbright et al. | |
| 5,262,360 A | 11/1993 | Holonyak, Jr. et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,325,386 A | 6/1994 | Jewell et al. | |
| 5,331,654 A | 7/1994 | Jewell et al. | |
| 5,337,074 A | 8/1994 | Thornton | |
| 5,337,183 A | 8/1994 | Rosenblatt et al. | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,373,522 A | 12/1994 | Holonyak, Jr. et al. | |
| 5,376,580 A | 12/1994 | Kish et al. | |
| 5,386,426 A | 1/1995 | Stephens | |
| 5,390,209 A | 2/1995 | Vakhshoori | |
| 5,396,508 A | 3/1995 | Bour et al. | |
| 5,404,373 A | 4/1995 | Cheng | |
| 5,412,678 A | 5/1995 | Treat et al. | |
| 5,412,680 A | 5/1995 | Swirhun et al. | |
| 5,416,044 A | 5/1995 | Chino et al. | |
| 5,428,634 A | 6/1995 | Bryan et al. | |
| 5,438,584 A | 8/1995 | Paoli et al. | |
| 5,446,754 A | 8/1995 | Jewell et al. | |
| 5,465,263 A | 11/1995 | Bour et al. | |
| 5,475,701 A | 12/1995 | Hibbs-Brenner | |
| 5,493,577 A | 2/1996 | Choquette et al. | |
| 5,497,390 A | 3/1996 | Tanaka et al. | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodzinski et al. | |
| 5,561,683 A | 10/1996 | Kwon | |
| 5,567,980 A | 10/1996 | Holonyak, Jr. et al. | |
| 5,568,498 A | 10/1996 | Nilsson | |
| 5,568,499 A | 10/1996 | Lear | |
| 5,574,738 A | 11/1996 | Morgan | |
| 5,581,571 A | 12/1996 | Holonyak, Jr. et al. | |
| 5,586,131 A | 12/1996 | Ono et al. | |
| 5,590,145 A | 12/1996 | Nitta | |
| 5,598,300 A | 1/1997 | Magnusson et al. | |
| 5,606,572 A | 2/1997 | Swirhun et al. | |
| 5,625,202 A | 4/1997 | Chai | |
| 5,625,729 A | 4/1997 | Brown | |
| 5,642,376 A | 6/1997 | Olbright et al. | |
| 5,645,462 A | 7/1997 | Banno et al. | |
| 5,646,978 A | 7/1997 | Kem et al. | |
| 5,648,978 A | 7/1997 | Sakata | |
| 5,661,075 A | 8/1997 | Grodzinski et al. | |
| 5,679,963 A | 10/1997 | Klem et al. | |
| 5,692,083 A | 11/1997 | Bennett | |
| 5,696,023 A | 12/1997 | Holonyak, Jr. et al. | |
| 5,699,373 A | 12/1997 | Uchida et al. | |
| 5,712,188 A | 1/1998 | Chu et al. | |
| 5,719,891 A * | 2/1998 | Jewell | 372/46.013 |
| 5,719,892 A * | 2/1998 | Jiang et al. | 372/50.11 |
| 5,724,374 A * | 3/1998 | Jewell | 372/45.01 |
| 5,726,805 A | 3/1998 | Kaushik et al. | |
| 5,727,013 A | 3/1998 | Botez et al. | |
| 5,727,014 A | 3/1998 | Wang et al. | |
| 5,729,566 A * | 3/1998 | Jewell | 372/96 |
| 5,747,366 A | 5/1998 | Brillouet et al. | |
| 5,774,487 A | 6/1998 | Morgan | |
| 5,778,018 A | 7/1998 | Yoshikawa et al. | |
| 5,781,575 A | 7/1998 | Nilsson | |
| 5,784,399 A | 7/1998 | Sun | |
| 5,790,733 A | 8/1998 | Smith et al. | |
| 5,805,624 A | 9/1998 | Yang et al. | |
| 5,818,066 A | 10/1998 | Duboz | |
| 5,828,684 A | 10/1998 | Van de Walle | |
| 5,835,521 A | 11/1998 | Ramdani et al. | |
| 5,838,705 A | 11/1998 | Shieh et al. | |
| 5,838,715 A | 11/1998 | Corzine et al. | |
| 5,864,575 A | 1/1999 | Ohiso et al. | |
| 5,881,085 A * | 3/1999 | Jewell | 372/46.013 |
| 5,882,948 A * | 3/1999 | Jewell | 438/22 |
| 5,892,784 A | 4/1999 | Tan et al. | |
| 5,892,787 A | 4/1999 | Tan et al. | |
| 5,896,408 A | 4/1999 | Corzine et al. | |
| 5,901,166 A | 5/1999 | Nitta et al. | |
| 5,903,588 A | 5/1999 | Guenter et al. | |
| 5,903,589 A | 5/1999 | Jewell | |
| 5,903,590 A | 5/1999 | Hadley et al. | |
| 5,908,408 A | 6/1999 | McGary et al. | |
| 5,936,266 A | 8/1999 | Holonyak, Jr. et al. | |
| 5,940,422 A | 8/1999 | Johnson | |
| 5,953,362 A | 9/1999 | Pamulapati et al. | |
| 5,978,398 A | 11/1999 | Ramdani et al. | |
| 5,978,401 A | 11/1999 | Morgan | |
| 5,978,408 A | 11/1999 | Thornton | |
| 5,995,531 A | 11/1999 | Gaw et al. | |
| 6,002,705 A | 12/1999 | Thornton | |
| 6,008,675 A | 12/1999 | Handa | |
| 6,014,395 A | 1/2000 | Jewell | |
| 6,043,104 A | 3/2000 | Uchida et al. | |
| 6,046,065 A | 4/2000 | Goldstein et al. | |
| 6,052,398 A | 4/2000 | Brillouet et al. | |
| 6,055,262 A | 4/2000 | Cox et al. | |
| 6,060,743 A | 5/2000 | Sugiyama et al. | |
| 6,078,601 A | 6/2000 | Smith | |
| 6,086,263 A | 7/2000 | Selli et al. | |
| 6,133,590 A | 10/2000 | Ashley et al. | |
| 6,144,682 A | 11/2000 | Sun | |
| 6,154,480 A | 11/2000 | Magnusson et al. | |
| 6,185,241 B1 | 2/2001 | Sun | |
| 6,191,890 B1 | 2/2001 | Baets et al. | |
| 6,208,681 B1 | 3/2001 | Thornton | |
| 6,212,312 B1 | 4/2001 | Grann et al. | |
| 6,238,944 B1 | 5/2001 | Floyd | |
| 6,266,357 B1 * | 7/2001 | Feld et al. | 372/46 |
| 6,269,109 B1 | 7/2001 | Jewell | |
| 6,297,068 B1 | 10/2001 | Thornton | |
| 6,302,596 B1 | 10/2001 | Cohen et al. | |
| 6,339,496 B1 | 1/2002 | Koley et al. | |
| 6,369,403 B1 | 4/2002 | Holonyak, Jr. | |
| 6,372,533 B2 | 4/2002 | Jayaraman et al. | |
| 6,392,257 B1 | 5/2002 | Ramdani et al. | |
| 6,410,941 B1 | 6/2002 | Taylor et al. | |
| 6,411,638 B1 | 6/2002 | Johnson et al. | |
| 6,427,066 B1 | 7/2002 | Grube | |
| 6,455,879 B1 | 9/2002 | Ashley et al. | |
| 6,459,709 B1 | 10/2002 | Lo et al. | |
| 6,459,713 B2 | 10/2002 | Jewell | |
| 6,462,360 B1 | 10/2002 | Higgins, Jr. et al. | |
| 6,472,694 B1 | 10/2002 | Wilson et al. | |
| 6,477,285 B1 | 11/2002 | Shanley | |
| 6,487,230 B1 | 11/2002 | Boucart et al. | |
| 6,487,231 B1 | 11/2002 | Boucart et al. | |
| 6,490,311 B1 | 12/2002 | Boucart et al. | |
| 6,493,366 B1 * | 12/2002 | Johnson et al. | 372/45.011 |

| | | | |
|---|---|---|---|
| 6,493,371 | B1 | 12/2002 | Boucart et al. |
| 6,493,372 | B1 | 12/2002 | Boucart et al. |
| 6,493,373 | B1 | 12/2002 | Boucart et al. |
| 6,496,621 | B1 | 12/2002 | Kathman et al. |
| 6,498,358 | B1 | 12/2002 | Lach et al. |
| 6,501,973 | B1 | 12/2002 | Foley et al. |
| 6,515,308 | B1 | 2/2003 | Kneissl et al. |
| 6,535,537 | B1* | 3/2003 | Kinoshita ............... 372/50.11 |
| 6,535,541 | B1 | 3/2003 | Boucart et al. |
| 6,536,959 | B2 | 3/2003 | Kuhn et al. |
| 6,542,531 | B2 | 4/2003 | Sirbu et al. |
| 6,545,335 | B1* | 4/2003 | Chua et al. ................ 257/499 |
| 6,546,031 | B1 | 4/2003 | Jewell et al. |
| 6,548,908 | B2* | 4/2003 | Chua et al. ................ 257/773 |
| 6,553,051 | B1 | 4/2003 | Tan et al. |
| 6,556,607 | B1* | 4/2003 | Jewell ..................... 372/49.01 |
| 6,567,435 | B1 | 5/2003 | Scott et al. |
| 6,658,041 | B2* | 12/2003 | Uebbing ..................... 372/96 |
| 6,680,964 | B2* | 1/2004 | Kim et al. .................... 372/96 |
| 6,717,964 | B2* | 4/2004 | Jiang et al. .................... 372/20 |
| 6,782,021 | B2* | 8/2004 | Huang et al. .......... 372/45.013 |
| 6,801,558 | B2* | 10/2004 | Burak ..................... 372/50.11 |
| 6,822,995 | B2* | 11/2004 | Kwon ......................... 372/96 |
| 6,870,207 | B2* | 3/2005 | Taylor ........................ 257/217 |
| 6,914,925 | B2* | 7/2005 | Shinagawa et al. ......... 372/50.1 |
| 6,940,885 | B1* | 9/2005 | Cheng et al. ............... 372/50.1 |
| 7,054,345 | B2* | 5/2006 | Ryou et al. .............. 372/45.01 |
| 7,110,427 | B2* | 9/2006 | Johnson et al. .......... 372/43.01 |
| 2001/0004414 | A1 | 6/2001 | Kuhn et al. |
| 2001/0019566 | A1* | 9/2001 | Jewell ......................... 372/43 |
| 2002/0084525 | A1* | 7/2002 | Chua et al. ................ 257/743 |
| 2002/0154675 | A1 | 10/2002 | Deng et al. |
| 2002/0158265 | A1* | 10/2002 | Eisenbeiser ................. 257/98 |
| 2003/0072526 | A1 | 4/2003 | Kathman et al. |
| 2003/0165171 | A1* | 9/2003 | Jewell ......................... 372/46 |
| 2005/0208688 | A1* | 9/2005 | Otoma et al. ................ 438/22 |

FOREIGN PATENT DOCUMENTS

| | | |
|---|---|---|
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AlAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 2000 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low-Threshold 1.57- μm VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AlAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Phototonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", *IEEE Photon. Technol. Lett.*, 11(12), 1536-1538 (1999).

Miller et al., "Optical Bistability Due to Increasing Absorption", *Optics Letters*, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", *IEEE Photonics Technology Letters*, vol. 7, No. 5, May 1995, pp. 441-443.

Morgan et al., "High-Power Coherently Coupled 8×8 Vertical Cavity Surface Emitting Laser Array", *Appl. Phys Letters*, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", *Appl. Phys. Letters*, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206-207, Jan. 21, 1993.

Morgan et al., "Producible GaAs-based MOVPE-Grown Vertical-Cavity Top-Surface Emitting Lasers with Record Performance", *Elec. Lett.*, vol. 31, No. 6, pp. 462-464, Mar. 16, 1995.

Morgan et al., "Progress and Properties of High-Power Coherent Vertical Cavity Surface Emitting Laser Arrays", *SPIE*, Vo. 1850, Jan. 1993, pp. 100-108.

Morgan et al., "Progress in Planarized Vertical Cavity Surface Emitting Laser Devices and Arrays", *SPIE*, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", *IEEE Photonics Technology Letters*, vol. 4, No. 4, Apr. 1993, pp. 374-377.

Morgan et al., "Vertical-cavity surface-emitting laser arrays", Invited Paper, *SPIE*, vol. 2398, Feb. 6, 1995, pp. 65-93.

Morgan et al., Vertical-cavity surface emitting lasers come of age, Invited paper, *SPIE*, vol. 2683, 0-8194-2057, Mar. 1996, pp. 18-29.

Morgan, "High-Performance, Producible Vertical Cavity Lasers for Optical Interconnects", *High Speed Electronics and Systems*, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", *Electronic Letters*, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", *IEEE Photon. Technol. Lett*, 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$=650nm) photopumped (pulsed, 300 K) laser operation of a vertical-cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", *Appl. Opt.*, vol. 34, No. 14, pp. 2414-2420, 1995.

S.S. Wang and R. Magnusson, "Theory and Applications of Guided-Mode Resonance Filters", *Appl. Opt.*, vol. 32, No. 14, pp. 2606-2613, 1993.

Sah, et al., "Carrier Generation and Recombination in *P-N* Junctions and *P-N* Junction Characteristics," Proceedings of the IRE, pp. 1228-1243, Sep. 1957.

Schubert, "Resonant Cavity Light-Emitting Diode", *Appl. Phys. Lett.*, vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

* cited by examiner

INP BASED LONG WAVELENGTH VCSEL

BACKGROUND

The invention pertains to laser light sources and particularly to vertical cavity surface emitting lasers. More particularly, the invention pertains to long wavelength surface emitting lasers.

A vertical cavity surface emitting laser (VCSEL) may include a first distributed Bragg reflector (DBR), also referred to as a mirror stack, formed on top of a substrate by semiconductor epitaxial growth techniques, an active region formed on top of the first mirror stack, and a second mirror stack formed on top of the active region. The VCSEL may be driven by a current forced through the active region, typically achieved by providing a first contact on the reverse side of the substrate and a second contact on top of the second mirror stack. The first contact may instead be on top of the first mirror stack in a coplanar arrangement.

VCSEL mirror stacks are generally formed of multiple pairs of layers often referred to as mirror pairs. The pairs of layers are formed of a material system generally consisting of two materials having different indices of refraction and being lattice matched to the semiconductor substrate. For example, a GaAs based VCSEL typically uses an AlAs/GaAs or $Al_xGa_{1-x}As/Al_yGa_{1-y}As$ material system wherein the different refractive index of each layer of a pair is achieved by altering the aluminum content in the layers. The number of mirror pairs per stack may range from 20 to 50 to achieve a high percentage of reflectivity, depending on the difference between the refractive indices of the layers. The larger number of pairs increases the percentage of reflected light.

In many VCSELS, conventional material systems perform adequately. However, new products are being developed requiring VCSELs which emit light having longer wavelengths. VCSELs emitting light having a longer wavelength are of great interest in the optical telecommunications industry because of the low fiber dispersion at 1310 nanometers (nm) and the low fiber loss at 1550 nm. As an example, a long wavelength VCSEL may be obtained by using a VCSEL having an InAlGaAs/InAlAs active region. When an InAlGaAs/InAlAs active region is used, an InP/InGaAsP material system lattice-matched to the InP substrate may be used for the mirror stacks in order to achieve a lattice match. The lattice matching between the substrate and the layers need to be substantially close to ensure a true crystal film growth.

In the InP material based system, it is practically impossible to achieve a suitable monolithic DBR-based mirror structure because of the insignificant difference in the refractive indices available in this lattice matched material system. As a result, many layers, or mirror pairs, are needed in order to achieve useful reflectivity. Useful reflectivity must generally be 99.8 percent or greater. Numerous attempts have been made to address this problem including a wafer bonding technique in which a DBR mirror is grown on a separate substrate and bonded to the active region. This technique has had only limited success and also the interface defect density in the wafer fusion procedure causes potential reliability problems. Other approaches to making satisfactory long wavelength VCSELs have been fraught with one problem or another. For instance, lattice matched InP based mirrors used for 1550 nm VCSELs have a host of problems in growth, processing, and optical performance. The low index contrast of lattice matched InGaAsP and InAlGaAs leads to the requirement of extremely thick (ten microns or thicker) DBRs of 45 or more mirror periods. The AlGaAsSb or AlGaPSb systems may be difficult to grow by MOCVD, and with good contrast, may still require at least 25 mirror pairs to achieve adequate reflectivity for VCSEL operation.

SUMMARY

The invention may be a vertical cavity surface emitting laser having a substrate, a first mirror situated on the substrate, an active region situated on the first mirror, a second mirror situated on the active region. The first mirror may have several pairs of layers with an oxidized layer in one or more pairs of that mirror. The invention may incorporate group III-V material. The substrate may include InP.

This invention may solve the problem of having to grow many layers of low contrast semiconductor DBRs by including a fully oxidized layer for half of each DBR pair in the lower mirror. A fully oxidized InAlAs, InAlGaAs, AlAsSb, AlGaAsSb, AlGaPSb, or AlPSb layer converts to $Al_xO_y$, and when combined with InP, may have enough index contrast to reduce the required number of mirror pairs to less than six. Portions of the VCSEL structure may be effectively lattice matched. An electrical circuit may be completed by making an electrical contact on the second mirror and another contact that may be intracavity on the first mirror.

Similar to 850 nm AlGaAs oxidation, a ring of spoked trenches (more than four) may be etched into the semiconductor surface. The structure may then be subjected to an oxidizing environment until certain lower mirror layers are fully oxidized. Processing then may proceed similarly to standard intracavity contact processing, with the bottom contact electrical current flowing through the lower conductive semiconductor layer between the etched trenches. Other options such as reversed growth design, oxidation, and wafer bonding are also possible means for utilizing fully oxidized InP based mirrors.

DESCRIPTION

Figure 1:
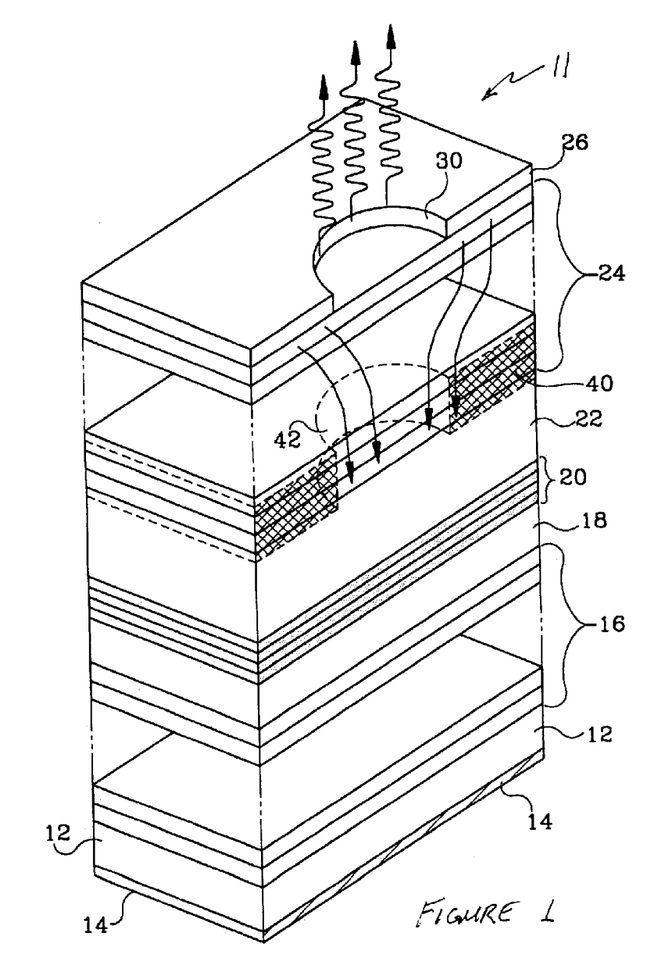
FIG. 1 illustrates a vertical cavity surface emitting laser.

FIG. 1 is a representation showing a perspective illustration of a structure for a vertical cavity surface emitting laser 11. A substrate 12 may be disposed on an electrical contact 14. A first mirror stack 16 and a bottom graded index region 18 may be progressively disposed, in layers, on substrate 12. A quantum well active region 20 may be formed and a top graded index region 22 may be disposed over active region 20. A top mirror stack 24 may be formed over the active region and a conductivity layer 26 may form an electrical contact. Current may flow from upper contact 26 to lower contact 14. This current may pass through active region 20. Upward arrows in FIG. 1 illustrate the passage of light through an aperture 30 in upper contact 26. The downward arrows illustrate the passage of current downward from upper contact 26 through upper mirror stack 24 and the active region 20. An ion implantation 40 may form an annular region of electrically isolated material. A central opening 42 of electrically conductive material may remain undamaged during the ion implantation process. As a result, current passing from upper contact 26 to lower contact 14 may be forced to flow through conductive opening 42 and thereby be selectively directed to pass through a preselected portion of active region 20.

Figure 2:
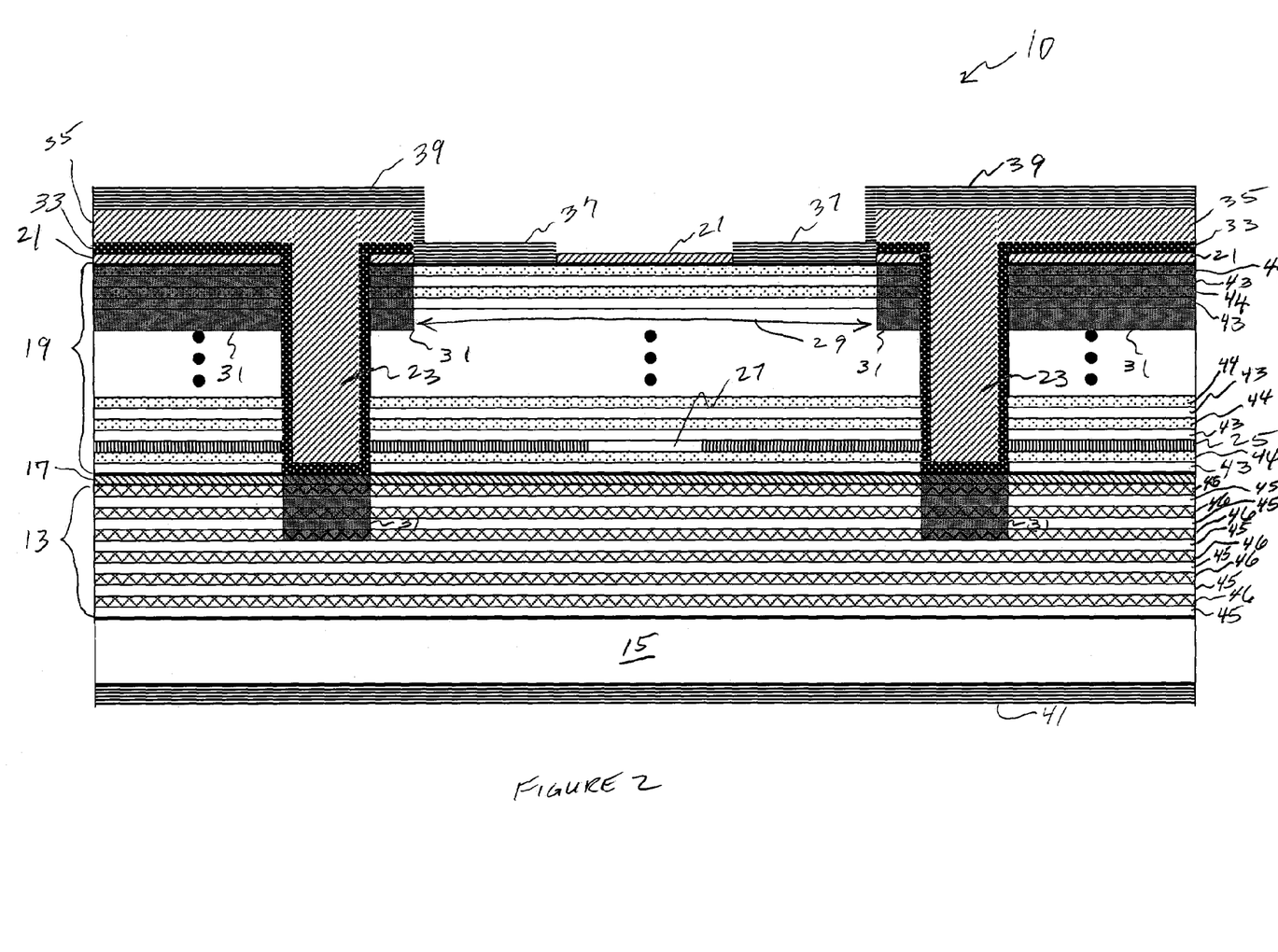
FIG. 2 reveals an illustrative example of a long wavelength InP material based VCSEL.

FIG. 2 shows an illustrative example of a long wavelength InP based VCSEL 10. A long wavelength may range from about 1200 nm through about 1800 nm. FIG. 2 is not necessarily drawn to scale. There may be a lower (DBR) mirror 13 formed on an InP substrate 15. An active layer or cavity 17 may be formed on lower mirror 13. On active layer or cavity 17 may be an upper (DBR) mirror 19. Formed on upper mirror 19 may be a layer 21 of oxide. A trench 23 may be etched through the oxide layer 21 and upper mirror 19 down to but not into active layer 17. Since FIG. 2 shows a side view of structure 10, trench 23 may appear to be two trenches. It is one trench because trench 23 and its associated structure 10 may be circular. Near the lower part of upper mirror may be a layer 25 having a high content of aluminum. Layer 25 may be oxidized via the trench with a high temperature vapor, oxidizing agent or anything else that may cause the aluminum layer to oxidize at a controllable rate. Not the whole layer 25 is oxidized. It may be oxidized only to an extent to form an aperture 27 within the non-oxidized area for current control and confinement.

A mask (not shown) may be put on the central portion of structure 10 as shown by a dimension 29. Then an ion implantation 31 may be applied to create an electrical isolation of structure and a confinement of current within dimension 29 in structure 10. Implantation 31 may penetrate a top portion of top mirror 19 and an upper part of lower mirror 13 via the bottom of trench 23. The mask may then be removed. A layer 33 of nitride or the like may be formed on oxide 21 and trench 23. On layer 33 a layer 35 of oxide may be formed. Then a mask covering the area of about where implantation 31 was applied and the central portion of oxide layer 35 not masked may be removed leaving nitride layer 33 below it. With the same mask, the central portion of nitride layer 33 may be removed. That mask may be removed and replaced with a mask covering about the same area as the previous mask plus a portion on oxide layer 21 in the center of structure 10. Then a ring-like shape of the unmasked area incorporating an exposed portion of oxide layer 21 may be removed. On everything at the top of the structure, a layer 37 of metal may be applied. The masking material including metal 37 on the masking may be removed leaving a ring of metal layer 37 on the top of upper mirror 19. This remaining layer 37 may be an electrical contact for VCSEL structure 10. A mask may be placed on the central portion (which may be circular) of oxide layer 21 and most of the metal ring layer 37. Another layer 39 of may be applied on oxide layer 35 plus an outside edge of metal layer 37 for connection to the latter. The mask may be removed exposing again the central portion of oxide layer 21 and metal contact layer 37. Contact layer 37 and metal layer 39 are connected to each other. The bottom of substrate 15 may have a metal layer 41 formed on it. Metal layer 41 may constitute the other electrical contact for VCSEL structure 10.

Top mirror 19 which is formed on active layer or cavity 17 may be composed of about 35 pairs of quarter-wavelength layers. The layers may consist of alternating materials. For instance, a pair of materials may be InGaAsP and InP, or AlGaAsSb and InP, or AlGaPSb and InP. Layer 43 may be a quarter-wavelength thick of InP material and layer 44 may be a quarter-wavelength thick of InAlGaAs or InGaAsP or AlGaAsSb or AlGaPSb material. On the other hand, Layer 44 may be a quarter-wavelength thick of InP material and layer 43 may be a quarter-wavelength thick of InAlGaAs or InGaAsP or AlGaAsSb or AlGaPSb material. Or the order of the layers for each pair may be reversed. The wavelength may be an optical wavelength of the light that may be emitted from structure 10. Each pair of mirror 19 may include layers 43 and 44. These layers may be lattice matched to InP, and may or may not be fully N-doped. They may be partially doped for the intra-cavity type of device. Not all of the pairs are shown for upper mirror 19 in FIG. 2. Another layer, a layer 25, in upper mirror 19 may be an easily oxidizable layer of a material relatively high in aluminum content such as InAlAs or other suitably oxidizable material. The extent of oxidation in layer 25 may extend to the inside periphery of a desired aperture for current confinement.

Active region/cavity 17 may be composed of InGaAs/InGaAsP; that is, it may have InAlGaAs strained quantum wells and InAlAs barriers, also of a strained composition. Active region/cavity 17 would not be doped but it may be unintentionally doped. Region 17 may have one to five quantum wells.

Lower mirror 13 may have a particular structure of about 6 pairs, or more or less, of layers 45 and 46. FIG. 2 shows the mirror or stack 13 of layers to begin with layer 45 on substrate 15. However, the mirror or stack 13 of pairs of layers may instead begin with layer 46 on substrate 15. The materials are selected and conditioned so that there is a significant disparity of the indices of refraction between the two layers 45 and 46 for each pair. Layer 45 may be a non-oxidized InP or AlGaInAs material. Layer 46 may be an oxidized material of InGaAsP, InAlAs, InAlGaAs, AlAsSb, AlGaAsSb, AlGaPSb, or AlPSb. When the material of layer 46 is fully oxidized, such material may convert to an $Al_xO_y$ material. When this oxidized layer 46 is combined with layer 45, there may be enough contrast between the layers to result in a sufficiently reflective lower mirror 13 having less than 6 pairs of layers.

Figure 3:
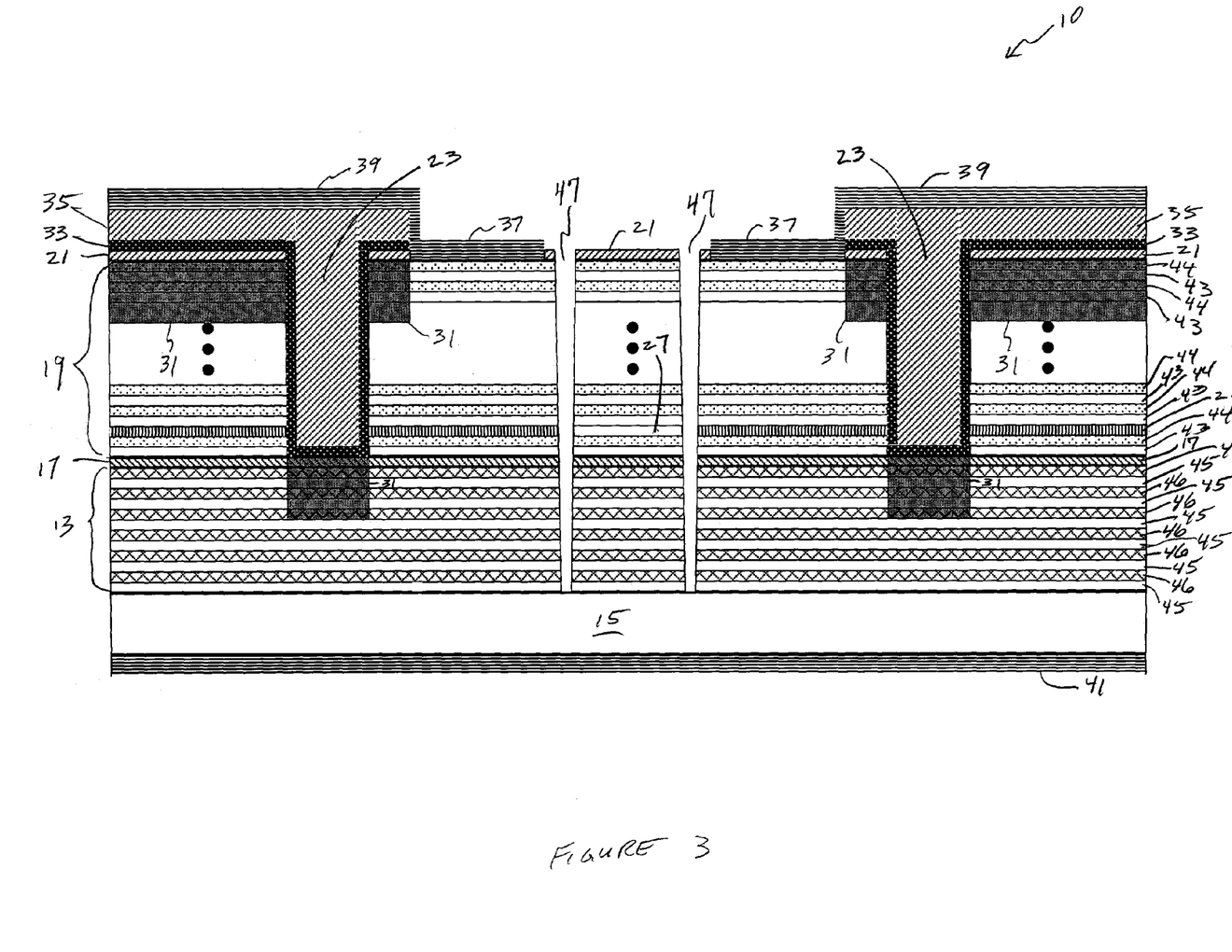
FIG. 3 shows the VCSEL of FIG. 2 with vertical trenches near the aperture for oxidizing certain layers in the lower mirror.
Figure 4:
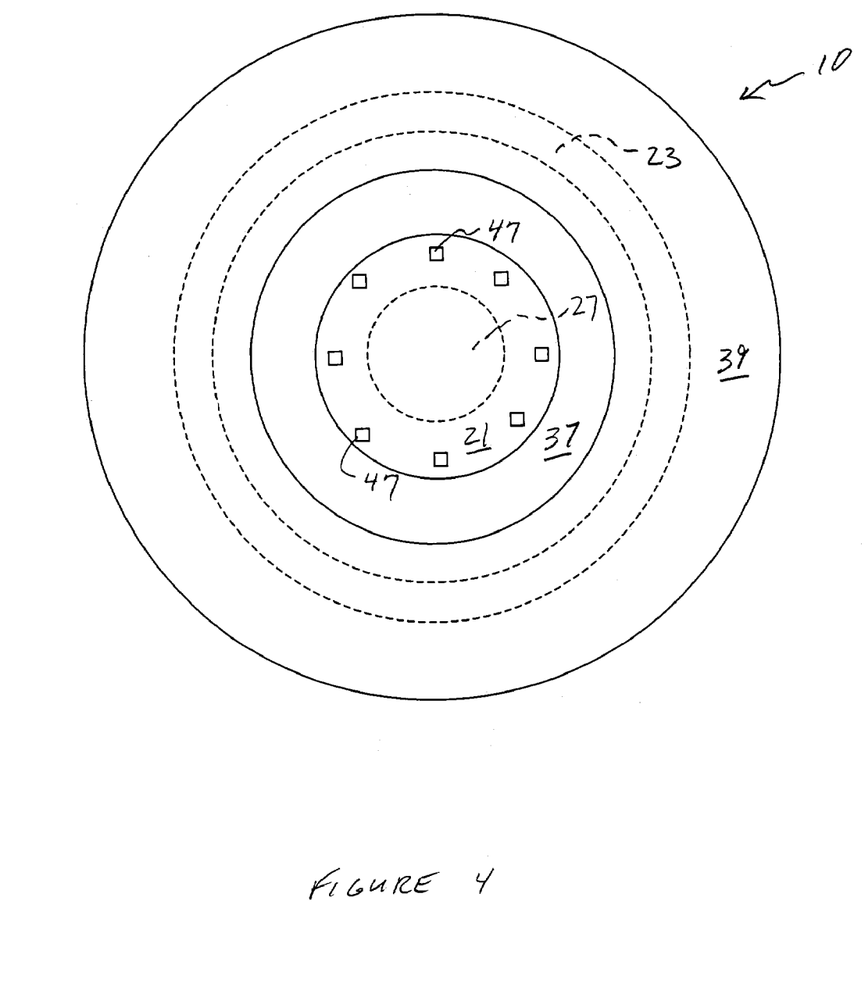
FIG. 4 is a top view of the VCSEL of FIG. 3 with the trenches.

Layers 46 may be oxidized in several ways. They may be oxidized from the edge of structure 10 if it is cut or sawed from a wafer as a separate chip or die. Or, as illustrated in FIG. 3, vertical trenches 47 may be made from the top down through oxidizable layers 46 in lower mirror 13. Trenches 47 may be individual trenches of limited length and do not surround the device in a complete circle as trench 23 does, although they may be placed completely around the structure. The aluminum content of InAlAs, for example, may be about 52 percent, so as to be lattice matched to InP. Structure 10 of FIG. 3 may be put into and oxidizing environment such as a furnace with $H_2O$ steam. The environment in the furnace may range from 350 to 500 degrees Celsius. The structure may be subject to such environment for about 3 hours to fully oxidize layers 46 in lower mirror 13 via trenches 47. This oxidation should not affect the other layers since their resilience to this oxidation may be sufficiently significant to resist such oxidation. FIG. 4 shows a top view of structure 10 having trenches 47. This figure may not necessarily be drawn to scale or have the same scale of FIG. 3.

Figure 5:
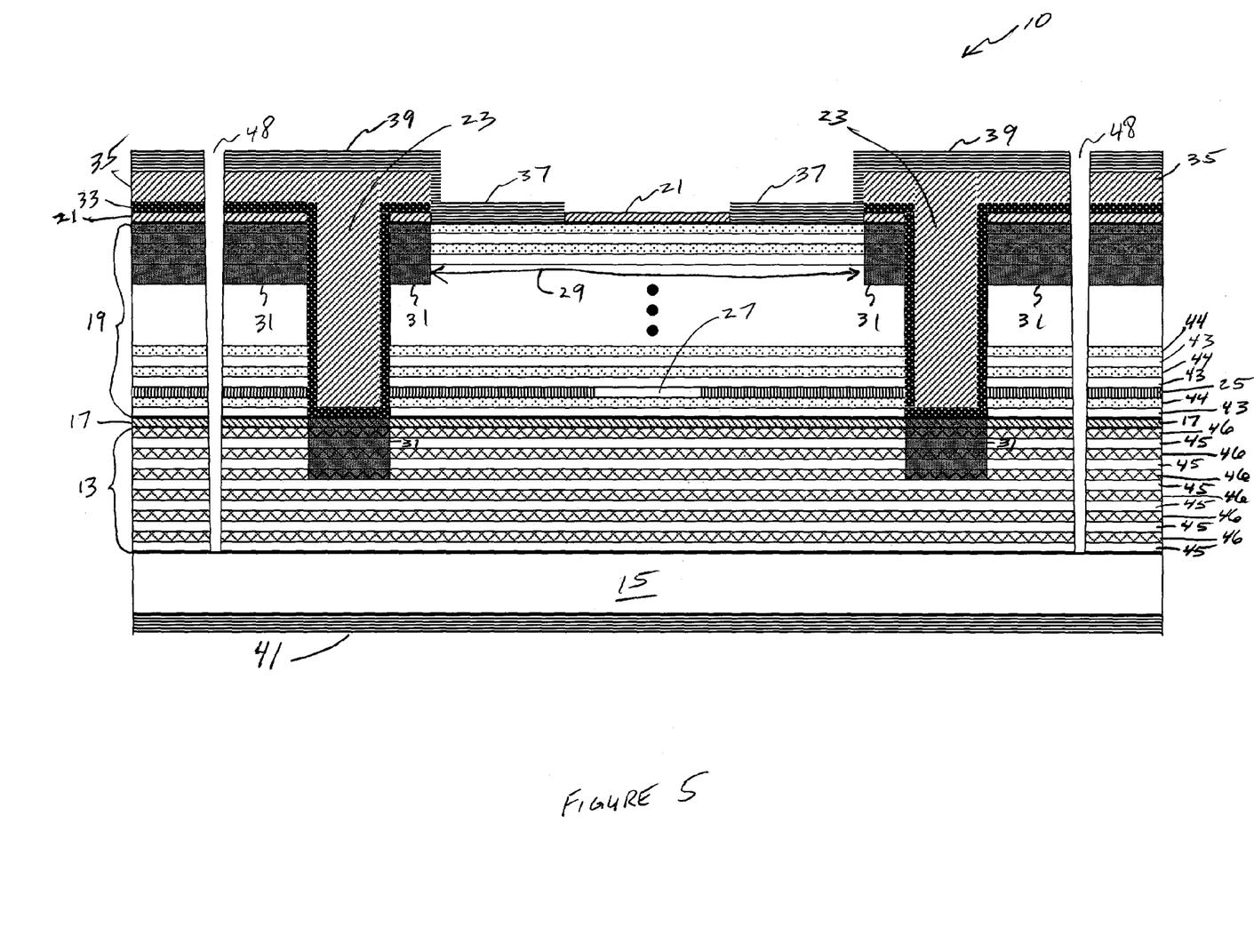
FIG. 5 shows the VCSEL of FIG. 2 with vertical trenches near the outside perimeter of the device.
Figure 6:
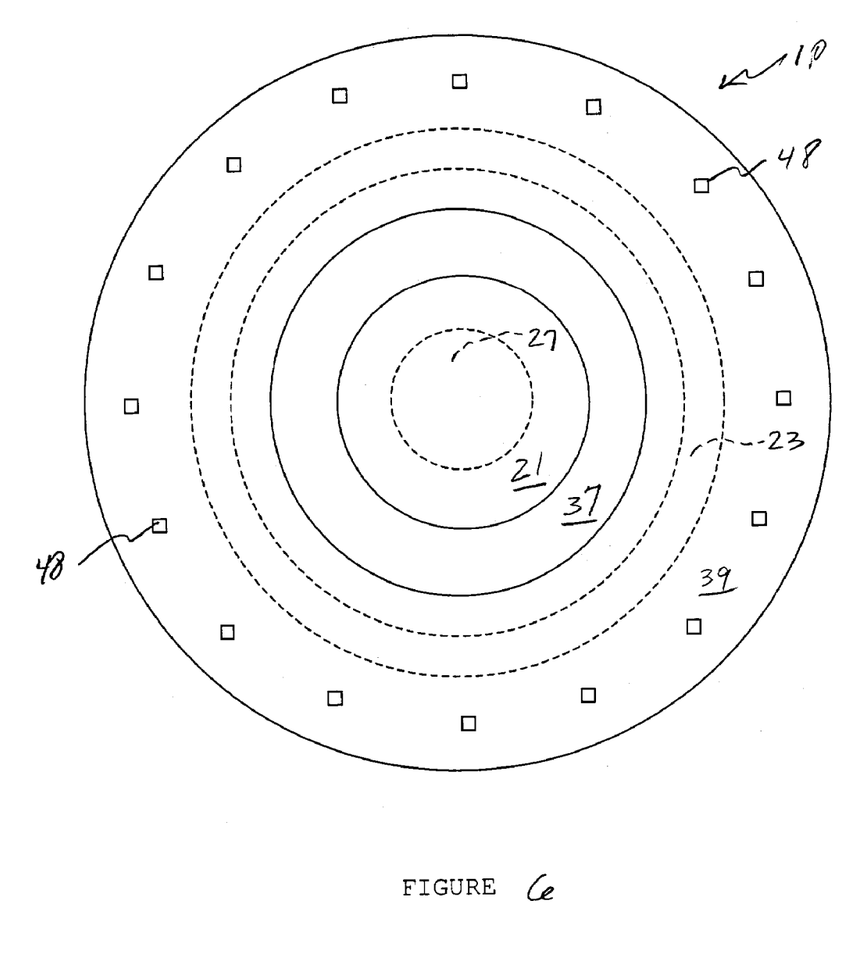
FIG. 6 is a top view of the VCSEL of FIG. 5 with the trenches.

FIG. 5 shows trenches 48 use to convey an oxidizing agent such as vapor at 300 to 500 degrees Celsius in a furnace to layers 46 of lower mirror 13. Trenches 48 may be situated at the periphery of structure 10. FIG. 6 shows a top view of structure 10 having trenches 48. This figure may not necessarily be drawn to scale or have the same scale of FIG. 5.

Figure 7:
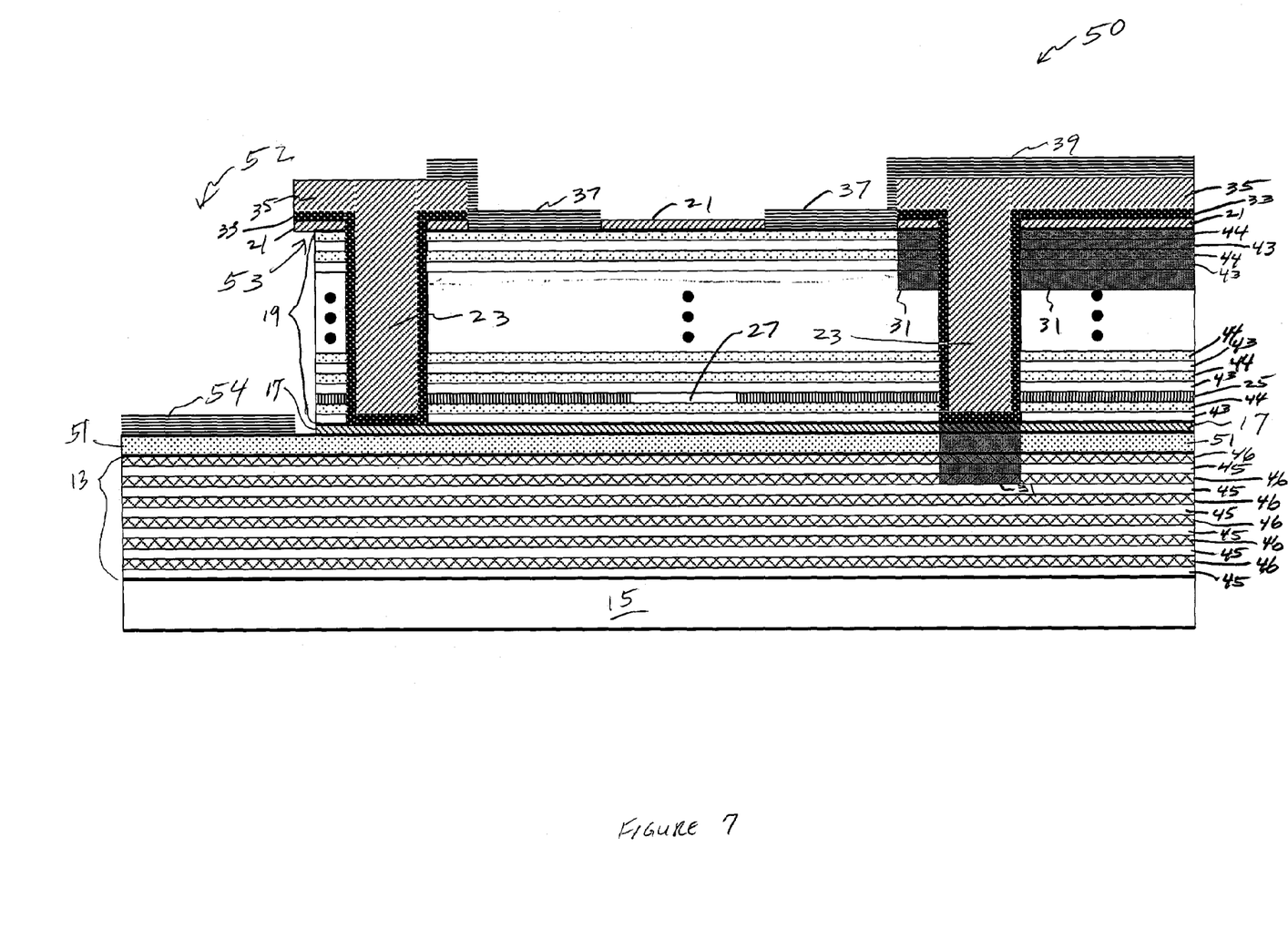
FIG. 7 reveals an illustrative example of the long wavelength VCSEL having an intracavity or coplanar configuration for the electrical contacts of the device.

FIG. 7 shows another illustrative structure 50 of the invention. FIG. 7 is not necessarily drawn to scale. Structure 50 may have an intracavity or coplanar design relative to the electrical contacts of the VCSEL. There may be a lower (DBR) mirror 13 formed on an InP substrate 15. An intra-cavity contact layer 51 may be formed on lower mirror 13. An active layer or cavity 17 may be formed on layer 51. On active layer or cavity 17 may be an upper (DBR) mirror 19. Formed on upper mirror 19 may be a layer 21 of oxide. A trench 23 may be etched through the oxide layer 21 and upper mirror 19 down to but not into active layer 17. FIG. 7 shows a side view of structure 50 and trench 23 might seem to be two trenches in this view. But it is one trench because trench 23 and its associated structure 50 may be a circular one. Near the lower part of upper mirror may be a layer 25 having a high content of aluminum. Layer 25 may be oxidized via the trench with a high temperature vapor, oxidizing agent or anything else that may cause the aluminum layer to oxidize at a controllable rate. Not the whole layer 25 is oxidized. It may be oxidized around a perimeter to form an aperture 27 within the non-oxidized area for current confinement and optical index guiding.

A mask (not shown) may be put on the central and left portions of structure 50 from the left edge of structure 50 to a short distance before trench 23 on the right side. Then an ion implantation 31 may be applied to create an electrical isolation from items outside of the top contact on the right side of structure 50 in FIG. 7. Implantation 31 may penetrate a top portion of top mirror 19 on both sides of that portion of trench 23 and an upper part of lower mirror 13 via the bottom of trench 23 in that portion of structure 50. The mask may then be removed.

A layer 33 of nitride or the like may be formed on oxide 21 and in trench 23. On layer 33 a layer 35 of oxide may be formed. Then a mask may be applied covering the top area except the central portion of oxide layer 35 just inside the inside perimeter of trench 23. The central portion of oxide layer 35 may be removed leaving nitride layer 33 below it. With the same mask, the central portion of nitride layer 33 may be likewise removed. That mask may be stripped and replaced with a mask covering about the same area as the previous mask plus a portion on oxide layer 21 in the center of structure 50. Then a ring-like shape of the unmasked area incorporating an exposed portion of oxide layer 21 may be removed. On the top of structure 50, a layer 37 of metal may be applied. The masking material including metal 37 on the masking may be removed leaving a ring of metal layer 37 on the top of upper mirror 19. This ring-like layer 37 may be an electrical contact for VCSEL structure 50. A mask may be placed on the central portion (which may be circular) of oxide layer 21 and most of the metal ring layer 37. Another layer 39 of may be applied on oxide layer 35 plus an outside edge of metal layer 37 for connection to the latter. The mask may be removed exposing again the central portion of oxide layer 21 and metal contact layer 37. Contact layer 37 and metal layer 39 are connected to each other.

Another mask may be formed on the top of structure 50 except for a portion just to the left of trench 23 of FIG. 7. The unmasked left portion 52 over layers 35, 33 and 21 may be etched down in one step. Next, in that portion or area 52, mirror 19 and active area 17 may be etched down to intra-cavity contact layer 51. Then mirror 19 and active area 17 may be etched in towards the center of structure 50 resulting in an undercut 53 under layers 21, 33 and 35. A layer of metal may be formed on the top of structure 50 resulting in an electrical contact 54 on a left area of intra-cavity contact layer 51 but not touching the edge of mirror 19 and active region or layer 17 because of undercut 53. Contacts 54 and 37 are the two VCSEL contacts of co-planar structure 50. The mask and metal on it are removed from the structure.

Top mirror 19 which is formed on active layer or cavity 17 may be composed of about 35 pairs of quarter-wavelength layers. The layers may consist of alternating materials. For instance, a pair of materials may be InGaAsP and InP, or AlGaAsSb and InP, or AlGaPSb and InP. Layer 43 may be a quarter-wavelength thick of InP material and layer 44 may be a quarter-wavelength thick of InGaAsP or AlGaAsSb or AlGaPSb material. Each pair of mirror 19 may include layers 43 and 44. The order of layers 43 and 44 may be reversed. These layers may be lattice matched to InP and may or may not be fully N-doped. They may be partially doped for the intra-cavity type of device. Not all of the pairs are shown for upper mirror 19 in FIG. 7. One of the layers, that is layer 25, in upper mirror 19 may be an easily oxidizable layer of a material relatively high in aluminum content such as InAlAs or other suitably oxidizable material. The extent of oxidation in layer 25 may extend to the inside periphery of a desired aperture for current confinement.

Active region/cavity 17 may be composed of InAlGaAs/InAlAs; that is, it may have InAlGaAs strained quantum wells and InAlAs barriers, also of a strained composition. Active region/cavity 17 would not be doped but it may be unintentionally doped. Region 17 may have one to five quantum wells.

Lower mirror 13 may have a particular structure of only about 6 pairs, or less, of layers 45 and 46. There may be design reasons to have one or a few more pairs. The materials are selected and conditioned so that there is a significant disparity of the indices of refraction between two layers 45 and 46 for each pair. Layer 45 may be a non-oxidized InP or AlGaInAs material. Layer 46 may be an oxidized material of InGaAsP, InAlAs, InAlGaAs, AlAsSb, AlGaAsSb, AlGaPSb, or AlPSb. When the material of layer 46 is fully oxidized, such material may convert to an $Al_xO_y$ material. When this oxidized layer 46 is combined with layer 45, there may be enough contrast between the layers to result in a sufficiently reflective lower mirror 13 having less than 6 pairs of layers. The order of layers 45 and 46 may be reversed.

Figure 8:
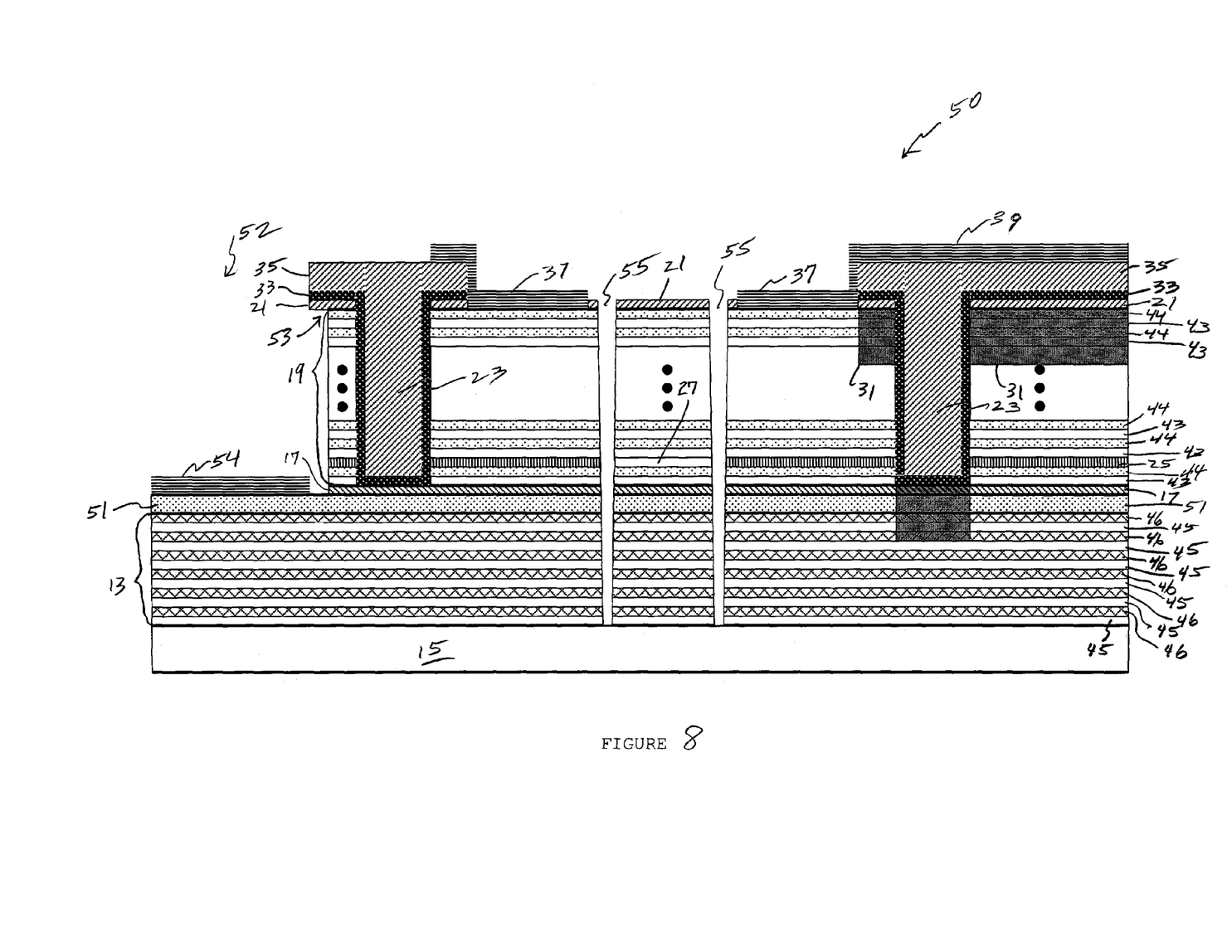
FIG. 8 shows the VCSEL of FIG. 7 with vertical trenches near the aperture for oxidizing certain layers in the lower mirror.

Layers 46 may be oxidized in several ways. They may be oxidized from the edge of structure 50 if it is cut or sawed from a wafer as a separate chip or die. Or, as illustrated in FIG. 8, vertical trenches 55 may be made from the top down through oxidizable layers 46 in lower mirror 13. Trenches 55 may be individual trenches of limited length and do not surround the device in a complete circle as trench 23 does, although they may be placed completely around the structure. The aluminum content of InAlAs for example may be about 52 percent. Structure 50 of FIG. 8 may be put into and oxidizing environment such as a furnace with $H_2O$ steam. The environment in the furnace may range from 300 to 500 degrees Celsius. The structure may be subject to such environment until layers 46 are fully oxidized in lower mirror 13 via trenches 55. This oxidation should not affect the other layers since their resilience to this oxidation may be sufficiently significant to resist or slow the rate of steam oxidation.

Figure 9:
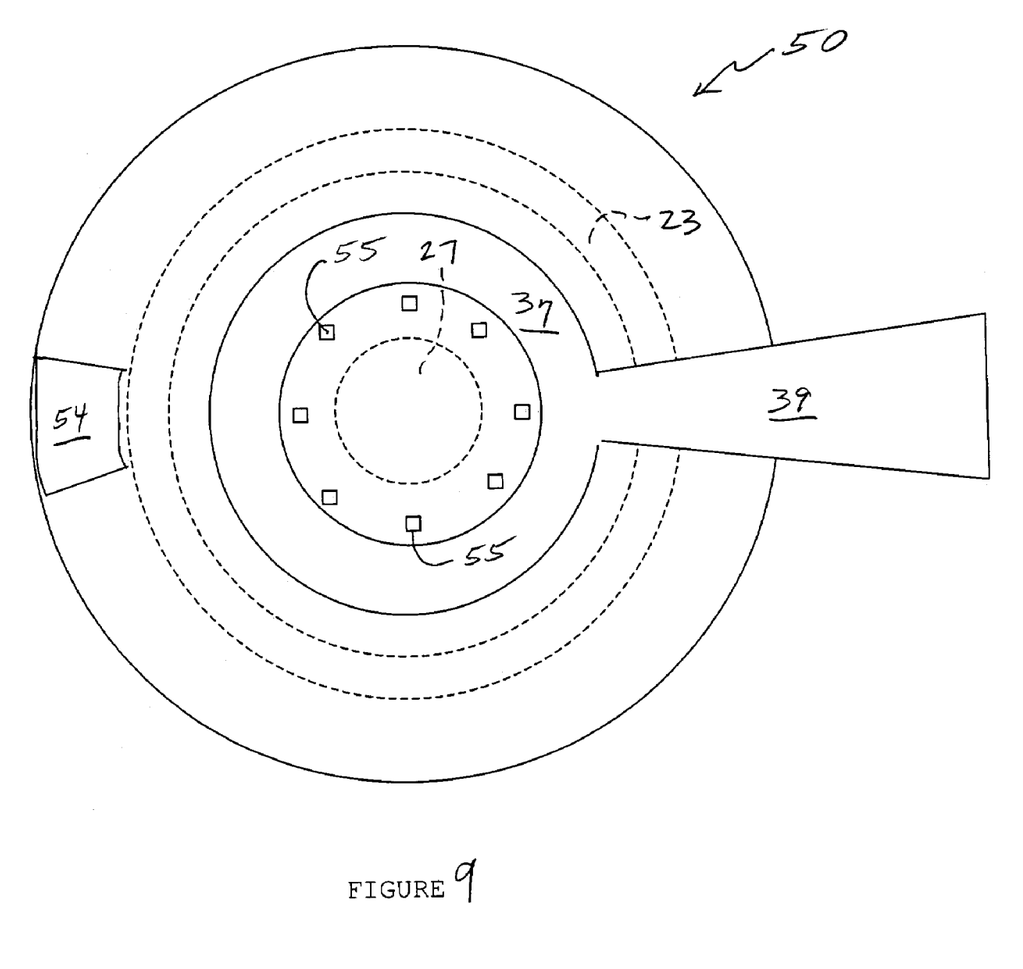
FIG. 9 is a top view of the VCSEL of FIG. 7 with the trenches.

FIG. 9 shows a top view of structure 50 having trenches 55. This figure may not necessarily be drawn to scale or have the same scale of FIG. 8. Trenches 55 may be placed in a perimeter outside of that of trench 23 in a similar manner as trenches 48 in FIG. 6.

Figure 10:
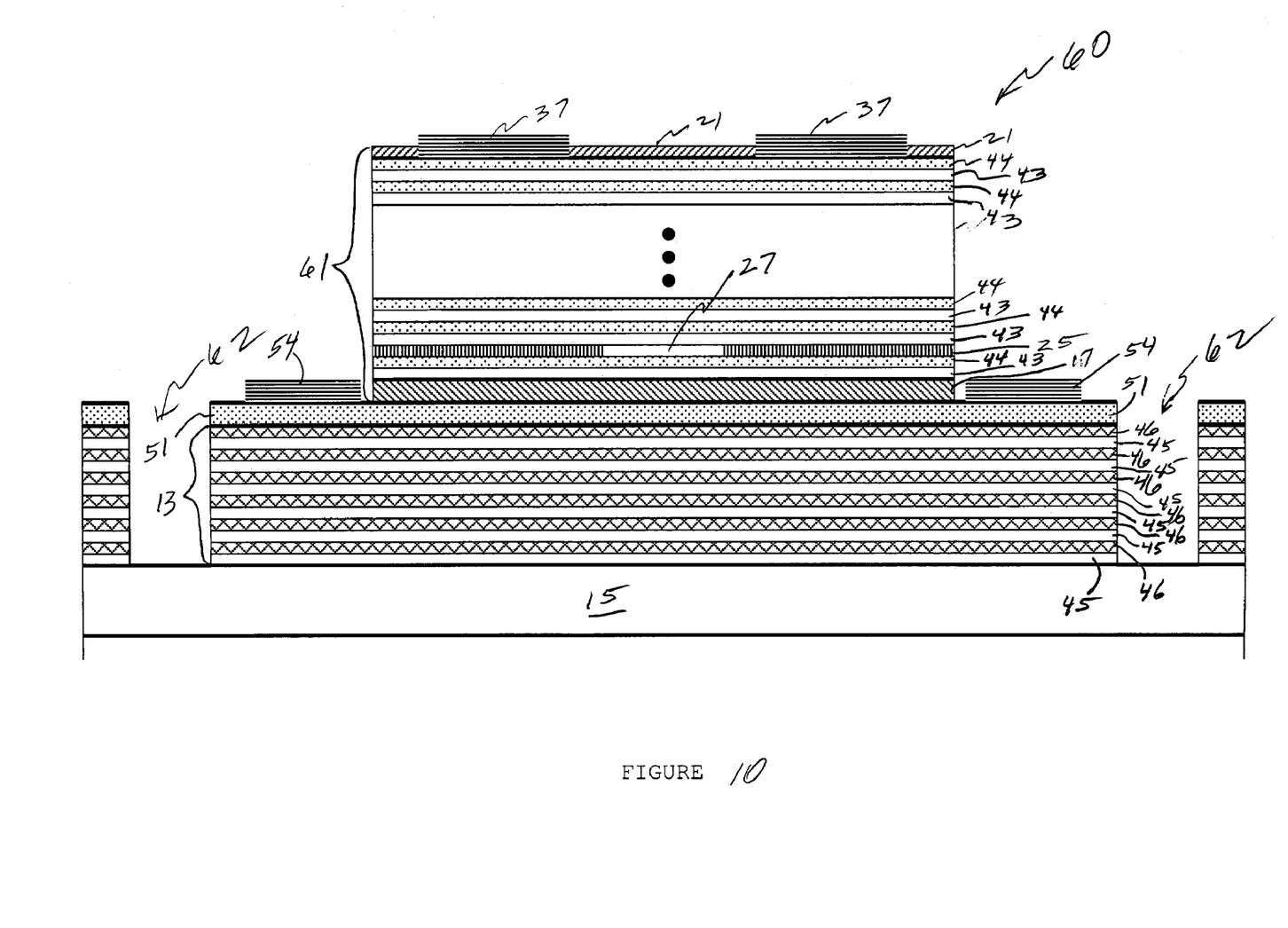
FIG. 10 reveals an illustrative example of a long wavelength VCSEL having a mesa-like island structure with a continuous isolation trench around the lower portion of the device that may be utilized in the oxidation of certain layers in the lower mirror.

FIG. 10 shows a structure 60 having a mesa-like island 61. The oxidizable layers 46 of lower mirror 13 may be oxidized via a ring-like trench 62 of structure 60 which may also be used for isolation purposes for structure 60 similar to those of trench 23 in structure 10 of FIG. 2. An alternative way for oxidizing layers 46 may be done via trenches similar to trenches 47 of structure 10 in FIGS. 3 and 4, or trenches 48 in FIGS. 5 and 6, as discussed above.

Although the invention has been described with respect to at least one illustrative embodiment, many variations and modifications will become apparent to those skilled in the art upon reading the present specification. It is therefore the intention that the appended-claims be interpreted as broadly as possible in view of the prior art to include all such variations and modifications.

What is claimed is:

1. A long wavelength vertical cavity surface emitting laser comprising:
    a substrate;
    a first mirror proximate said substrate and having a plurality of layers including at least one pair of layers having a non-oxidized AlGaInAs layer and an oxidized layer, wherein the oxidized layer comprises at least one of oxidized InGaAsP, InAlAs, InAlGaAs, AlAsSb, AlGaAsSb, AlGaPSb or AlPSb;
    a cavity proximate to said first mirror;
    a second mirror proximate to said cavity, said second mirror comprising a partially oxidized layer for confining current; and
    at least two contacts configured to cause current to flow through at least a portion of the vertical cavity surface emitting laser.

2. The laser of claim 1, wherein said first mirror is proximate to an InP substrate.

3. The laser of claim 1, wherein said second mirror comprises a plurality of layers having at least one InP layer.

4. The laser of claim 1, wherein said cavity has at least one quantum well.

5. The laser of claim 4, wherein the at least one quantum well is configured to emit energy at a wavelength greater than 1200 nm.

6. The laser of claim 1, further comprising:
    a first electrical contact on said second mirror; and
    a second electrical contact on the substrate.

7. The laser of claim 1, further comprising:
    an intra-cavity contact layer situated between said first mirror and said cavity;
    a first contact on said second mirror; and
    a second contact on said intra-cavity contact layer.

8. The laser of claim 1, wherein the plurality of layers of the first mirror has six or fewer pairs of layers.

* * * * *

UNITED STATES PATENT AND TRADEMARK OFFICE
CERTIFICATE OF CORRECTION

PATENT NO. : 7,433,381 B2
APPLICATION NO. : 10/606104
DATED : October 7, 2008
INVENTOR(S) : Wang et al.

It is certified that error appears in the above-identified patent and that said Letters Patent is hereby corrected as shown below:

Title Page
Item 56, References Cited, U.S. Patent Documents, replace "5,719,891   *   2/1998   Jewell ................... 372/46.013" with --5,719,891   *   2/1998   Jewell ................... 372/45--
Item 56, References Cited, Other Publications, replace "Choquette et al., "High Single Mode Operation from Hybrid Ion Implanted/Selectively Oxidezed VCSELs", 2000 IEEE 17$^{th}$ International Semiconductor Laser Conference, Monterrey, CA pp. 59-60." with --Choquette et al., "High Single Mode Operation from Hybrid Ion Implanted/Selectively Oxidezed VCSELs", 200 IEEE 17$^{th}$ International Semiconductor Laser Conference, Monterrey, CA pp. 59-60.--
Item 56, References Cited, Other Publications, replace "Morgan eta l., Vertical-cavity surface emitting lasers come of age, Invited paper, SPIE, vol. 2683 0-8194-2057, Mar. 1996, pp. 18-29." with --Morgan et al., "Vertical-cavity surface emitting lasers come of age", Invited paper, SPIE, vol. 2683 0-8194-2057, Mar. 1996, pp. 18-29.--
Item 56, References Cited, Other Publications, replace "Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203." with --Smith, R.E. et al., "Polarization-Sensitive Subwavelength Antireflection Surfaces on a Semiconductor for 975 NM", *Optics Letters*, vol. 21, No. 15, Aug. 1, 1996, pp. 1201-1203.--
Item 56, References Cited, Other Publications, replace "Tautm, et al., Commercialization of Honeywell's VCSEL Technology, Published in Proceedings fo the SPIE, vol. 3946, SPI, 2000, 12 pages." with --Tautm, et al., "Commercialization of Honeywell's VCSEL Technology", Published in Proceedings of the SPIE, vol. 3946, SPI, 2000, 12 pages.--
Item 56, References Cited, Other Publications, include the following omitted references:
--6,704,343 B2   03/2004   Deng et al.   ................. 372/97
6,810,056 B1   10/2004   Lipson et al.   ................. 372/46.01
6,829,281 B2   12/2004   Deng et al.   ................. 372/96
2004/0091010 A1   05/2004   Choquette et al.   .......... 372/044--

Column 2
Line 32, change "options" to --options,--
Line 34, change "InP based mirrors" to --InP-based mirrors--

Column 3
Line 33, change "upper mirror" to --upper mirror 19--
Line 35, change "trench" to --trench 23--
Line 42, change "structure 10" to --the VCSEL 10--
Line 56, change "structure 10" to --the VCSEL 10--
Line 59, change "structure 10" to --the VCSEL 10--
Line 66, change "of may be applied" to --or metal may be applied--

CERTIFICATE OF CORRECTION (continued)
U.S. Pat. No. 7,433,381 B2

Column 4
Line 6, change "Top mirror 19" to --Top mirror 19,--
Line 6, change "cavity 17" to --cavity 17,--
Line 19, change "structure 10" to --the VCSEL 10--
Line 60, change "structure 10" to --the VCSEL 10--
Line 61, change "put into and oxidizing environment" to --put into an oxidizing environment,--

Column 5
Line 1, change "structure 10" to --the VCSEL 10--
Line 7, change "structure 10" to --the VCSEL 10--
Line 8, change "structure 10" to --the VCSEL 10--
Line 22, change "this view. But" to --this view, but--
Line 24, change "upper mirror" to --upper mirror 19--
Line 25, change "trench" to --trench 23--
Line 61, change "of may be applied" to --of metal may be applied--

Column 6
Line 59, change "InAlAs for example" to --InAlAs, for example,--
Line 60, change "into and" to --into an--
Line 61, change "environment" to --environment,--

Column 7
Line 8, change "structure 60 which" to --structure 60, which--

Signed and Sealed this

Twenty-third Day of February, 2010

David J. Kappos
*Director of the United States Patent and Trademark Office*